United States Patent
Arnold et al.

(10) Patent No.: US 9,805,867 B2
(45) Date of Patent: Oct. 31, 2017

(54) ACOUSTICALLY QUIET CAPACITORS

(71) Applicant: Apple Inc., Cupertino, CA (US)

(72) Inventors: Shawn X. Arnold, San Jose, CA (US); Jeffrey M. Thoma, Mountain View, CA (US); Connor R. Duke, Sunnyvale, CA (US); Yanchu Xu, San Jose, CA (US); Nelson J. Kottke, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 767 days.

(21) Appl. No.: 13/957,342

(22) Filed: Aug. 1, 2013

(65) Prior Publication Data

US 2014/0076621 A1    Mar. 20, 2014

Related U.S. Application Data

(60) Provisional application No. 61/703,210, filed on Sep. 19, 2012, provisional application No. 61/724,242, filed on Nov. 8, 2012.

(51) Int. Cl.
*H01G 4/005* (2006.01)
*H01G 4/01* (2006.01)
(Continued)

(52) U.S. Cl.
CPC ............ *H01G 4/01* (2013.01); *B23K 26/22* (2013.01); *H01G 2/06* (2013.01); *H01G 2/10* (2013.01);
(Continued)

(58) Field of Classification Search
CPC . B23K 26/22; H01G 2/06; H01G 2/10; H01G 4/01; H01G 4/224; H01G 4/228;
(Continued)

(56) References Cited

U.S. PATENT DOCUMENTS 5,808,853 A * 9/1998 Dalal ................ H01L 21/563
257/738
6,657,133 B1 * 12/2003 Chee ................ H05K 1/0231
174/260

(Continued)

FOREIGN PATENT DOCUMENTS

WO    2012132952 A1    4/2012

OTHER PUBLICATIONS

Wikipedia Definition of "Copper".*
Panasonic, "Aluminum Electrolytic Capacitors", Sep. 2010, pp. EE186-EE188.

*Primary Examiner* — Steven T Sawyer
(74) *Attorney, Agent, or Firm* — Downey Brand LLP

(57) ABSTRACT

The described embodiments relate generally to printed circuit boards (PCBs) including a capacitor and more specifically to designs for mechanically isolating the capacitor from the PCB to reduce an acoustic noise produced when the capacitor imparts a piezoelectric force on the PCB. Conductive features can be mechanically and electrically coupled to electrodes located on two ends of the capacitor. The conductive features can be placed in corners where the amplitude of vibrations created by the piezoelectric forces is relatively small. The conductive features can then be soldered to a land pattern on the PCB to form a mechanical and electrical connection while reducing an amount of vibrational energy transferred from the capacitor to the PCB.

13 Claims, 7 Drawing Sheets

(51) Int. Cl.
*H05K 1/18* (2006.01)
*H05K 13/04* (2006.01)
*B23K 26/22* (2006.01)
*H05K 3/34* (2006.01)
*H01G 4/40* (2006.01)
*H01G 2/06* (2006.01)
*H01G 2/10* (2006.01)
*H01G 4/224* (2006.01)
*H01G 4/228* (2006.01)

(52) U.S. Cl.
CPC ............. *H01G 4/224* (2013.01); *H01G 4/228* (2013.01); *H01G 4/40* (2013.01); *H05K 1/181* (2013.01); *H05K 3/3442* (2013.01); *H05K 13/0465* (2013.01); *H05K 2201/10015* (2013.01); *H05K 2201/10636* (2013.01); *H05K 2201/10962* (2013.01); *H05K 2201/2045* (2013.01); *Y02P 70/611* (2015.11); *Y02P 70/613* (2015.11)

(58) Field of Classification Search
CPC ...... H01G 4/40; H05K 1/181; H05K 13/0465; H05K 3/3442; H05K 2201/10015; H05K 2201/10636; H05K 2201/10962; H05K 2201/2045; Y02P 70/611
USPC ............ 361/328, 329, 522, 541, 306.2, 782; 174/260
See application file for complete search history.

(56) References Cited

U.S. PATENT DOCUMENTS

| | | | |
|---|---|---|---|
| 6,903,920 B1* | 6/2005 | Prymak | H01G 2/065 361/306.1 |
| 7,689,390 B2 | 3/2010 | Du Toit et al. | |
| 2004/0174656 A1* | 9/2004 | MacNeal | H01G 4/30 361/306.3 |
| 2010/0071949 A1* | 3/2010 | Murakami | H01G 2/06 174/261 |
| 2012/0152604 A1 | 6/2012 | Ahn et al. | |
| 2013/0056252 A1 | 3/2013 | Fuji et al. | |

* cited by examiner

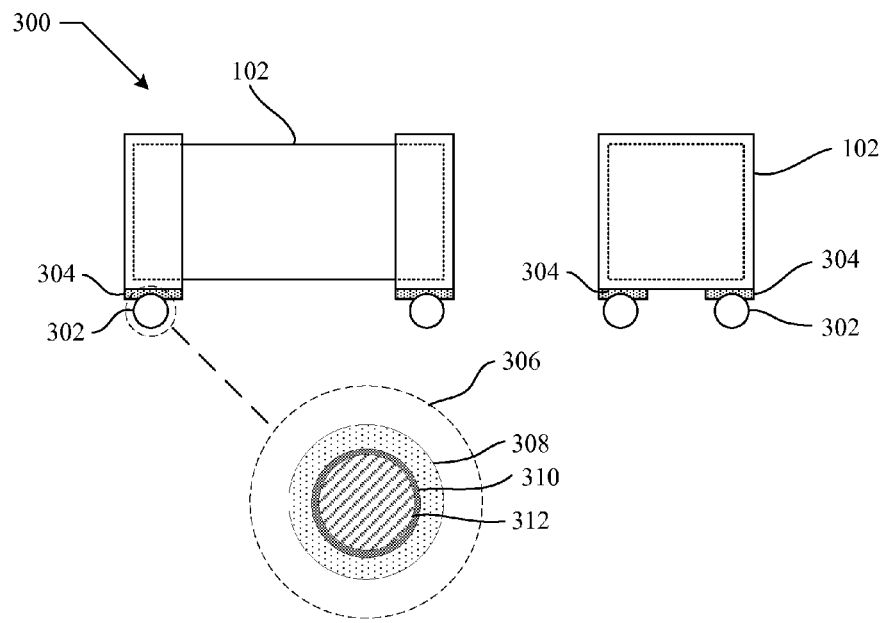
FIG. 3
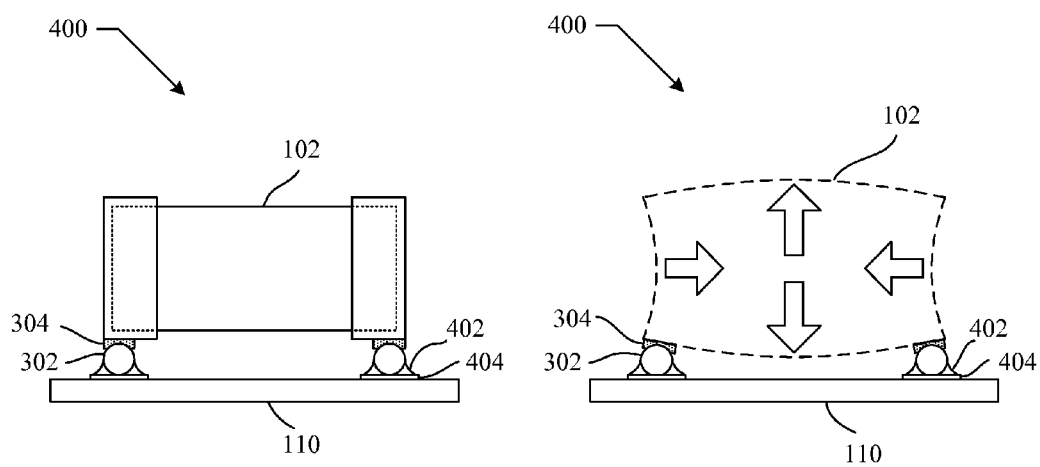
FIG. 4A                    FIG. 4B

ACOUSTICALLY QUIET CAPACITORS

CROSS-REFERENCE TO RELATED APPLICATIONS

The present application is related and claims priority to U.S. Provisional Patent Application No. 61/703,210, entitled "ACOUSTICALLY QUIET CAPACITORS," filed on Sep. 19, 2012, by THOMA et al., the contents of which are incorporated herein by reference in their entirety, for all purposes. The present application is also related and claims priority to U.S. Provisional Patent Application No. 61/724,242, entitled "ACOUSTICALLY QUIET CAPACITORS," filed on Nov. 8, 2012, by ARNOLD et al., the contents of which are hereby incorporated by reference in their entirety, for all purposes.

FIELD OF THE DESCRIBED EMBODIMENTS

The described embodiments relate generally to printed circuit boards (PCBs) including a capacitor and more specifically to designs for mechanically isolating the capacitor from the PCB to reduce an acoustic noise produced when the capacitor imparts an oscillating piezoelectric force on the PCB.

BACKGROUND

Printed circuit boards (PCBs) are commonly found in a variety of electronic devices, including computers, televisions and mobile devices. PCBs commonly include capacitors mounted to the PCB in order to perform a variety of functions. A capacitor can include two conductive plates separated by a dielectric such as ceramic. Certain classes of ceramic capacitors can exhibit a characteristic called piezo-electricity that can cause an internal generation of a mechanical strain in the ceramic resulting from an applied electrical field. The magnitude of the generated strain can be proportional to the strength of the electrical field, or the voltage difference applied across two conductors placed on either end of the ceramic material. When the capacitor is placed in an alternate current (AC) circuit, the ceramic within the capacitor can expand and contract at a frequency approximately equal to that of the AC supply.

This motion can cause several problems. First, if a capacitor is mechanically coupled to a membrane such as a PCB, these expansions and contractions can apply a force on the PCB. As a result, the entire PCB can vibrate in the audible frequency range. The effect can be particularly pronounced when the driving frequency is approximately equal to the resonance frequency of the PCB. The vibration of the PCB can also create acoustic sound waves. In some situations, the resulting sound waves can have enough amplitude to be heard by a user of a device. Secondly, excessive vibrations can weaken solder joints and other electrical connections on the PCB, increasing the likelihood that the device will fail.

Therefore, what is desired is a reliable way to mechanically and electrically couple a capacitor to a PCB while reducing an amount of vibrational energy that is transferred from the capacitor to the PCB.

SUMMARY OF THE DESCRIBED EMBODIMENTS

This paper describes various embodiments that relate to mechanically and electrically coupling a capacitor to a PCB while reducing an amount of vibrational energy transferred to the PCB. In one embodiment, a PCB assembly is disclosed. A capacitor can be received, including a dielectric disposed between two electrodes. A plurality of conductive features can be mechanically and electrically coupled to the electrodes on capacitor. Furthermore, the conductive features can be placed proximal to a piezo-electric node of the capacitor. A PCB can also be received and designed to include a land pattern configured to align with the conductive features. Moreover, the PCB can be coated with a solder mask in a region surrounding the land pattern to prevent excessive buildup of solder. Finally, a mechanical and electrical connection can be provided between the conductive features and the land pattern using solder, welding, or any other feasible means. The placement of the conductive features can minimize an amount of vibrational energy that can be transmitted from the capacitor to the PCB.

In another embodiment, a method for manufacturing a PCB assembly including a capacitor is described. The method includes aligning a land pattern in the PCB with a plurality of conductive features in the capacitor. The method may also include applying a solder mask to a region of the PCB surrounding the land pattern, and soldering the conductive features to the land pattern on the PCB.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

FIG. 3 shows a capacitor assembly including conductive spheres.

FIG. 4A shows an assembly in which a capacitor is coupled to a PCB using conductive spheres.

FIG. 4B shows a side view of how piezoelectric displacement affects an assembly in which a capacitor is coupled to a PCB using conductive spheres.

DETAILED DESCRIPTION OF SELECTED EMBODIMENTS

Figure 1A:
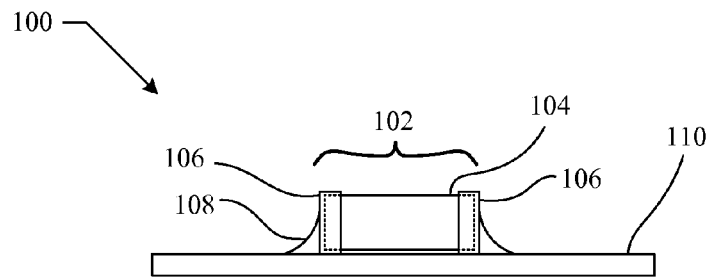
FIG. 1A shows a side view of a PCB including a capacitor.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

PCBs including ceramic capacitors can be found in a wide range of electronic devices. When an alternating electric field is applied across a ceramic capacitor, an alternating mechanical strain can be generated within the ceramic material. Unless this motion is isolated, vibrational energy can be transferred from the capacitor to the PCB, creating an acoustic noise that can be audible to a user of a device. The amount of vibrational energy transferred to the PCB can be reduced by mechanically and electrically coupling the capacitor to the PCB in four corners using conductive spheres or similar structures. By strategically placing contact points between the conductive spheres and the capacitor in regions where vibrational amplitude is low, the amount of force imparted on the PCB can be reduced, minimizing any acoustic noises resulting from the motion of the capacitor.

Embodiments consistent with the present disclosure may find application in a wide variety of electronic devices. In particular, current electronic devices using circuitry including small volume capacitors having high capacitance may use capacitor designs as disclosed herein. Indeed, small volume capacitors having large capacitance may include new types of ceramic materials having large piezoelectric constants. For example, some capacitors may include ceramics having titanium ions that provide a large piezoelectric characteristic to the material. Some electronic devices currently used may include extremely thin PCBs, which may be highly susceptible to couple acoustic vibrations from the capacitors mounted on them. Other embodiments may include flexible PCBs made of materials such as polyimide and other polymers. In such embodiments, the amount of acoustic coupling from a capacitor to the PCB may be influenced by the viscoelasticity in the materials used for the PCB. Also, the rigidity of the laminate forming the PCB has an impact on the acoustic coupling. For example, a PCB using rigid polyimide is more susceptible to acoustic coupling than a PCB using a flexible polyimide. The difference between a rigid or a flexible polyimide layer may include curing time and procedures, and the detailed chemical composition of the polymer and other components used during curing.

Acoustically quiet capacitors consistent with embodiments as disclosed herein provide acoustic damping such that they may be placed arbitrarily around the PCB. In that regard, no special concern or simulation may be necessary as to the orientation in the PCB of an acoustically quiet capacitor as disclosed herein. Also, the relative positioning of electronic components in the PCB may have no impact in the acoustic performance of the circuit, when acoustically quiet capacitors as disclosed here are used.

FIG. 1A shows a side view of a prior art assembly 100, including capacitor 102 coupled to PCB 110. Capacitor 102 can include two electrodes 106 and dielectric 105. Electrodes 106 can be formed from any conductive material such as copper. Furthermore, dielectric 105 can be formed from any suitable insulator. Ceramic is commonly used to create dielectric 105 due to the small size and low price of ceramics compared to other dielectric materials. Capacitor 102 can be mechanically and electrically coupled to PCB 110 using solder 108. PCB 110 can include at least one substrate layer and electrical traces for electrically coupling various components mounted on PCB 110, including capacitor 102. Solder 108 can form a fillet between PCB 110 and capacitor 102, providing a strong mechanical and electrical connection between electrodes 106 and a land pattern coupled to electrical traces on PCB 110.

Figure 1B:
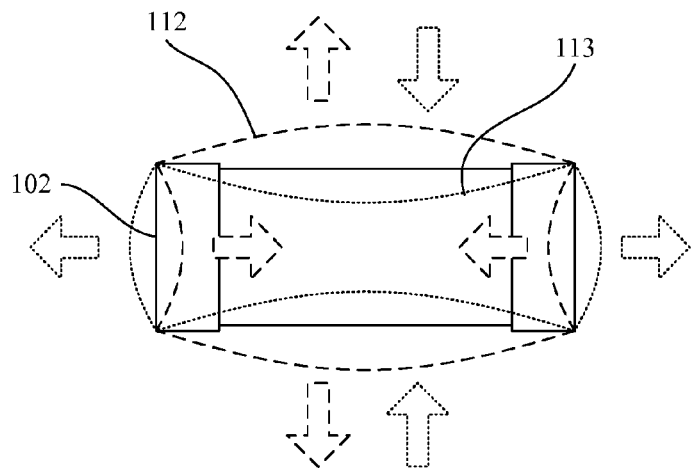
FIG. 1B shows a side view of a capacitor, illustrating a typical piezoelectric displacement.

FIG. 1B shows a side view of capacitor 102, showing how internal strain can change the shape of capacitor 102 when subjected to an electric field. Capacitor 102 can include a ferroelectric material such as a ceramic for a dielectric. Ferroelectric materials can create an electrical field when subjected to strain due to an orientation of crystals within the material. This process can also work in reverse, meaning that ferroelectric materials can expand and contract when placed in an electric field. Furthermore, the magnitude of the expansion and contraction can be proportional to the strength of the electrical field. Outline 112 shows a typical manner in which capacitor 102, formed from a ferroelectric material such as ceramic, can deform in the presence of an electric field. As is shown, an upper and lower surface of capacitor 102 can bow outwards and surfaces near electrodes 106 can bow inwards. The amount of deformation shown in FIG. 1B is exaggerated to better express the mode by which capacitor 102 deforms. When an alternating electrical field is applied to capacitor 102, such as in the case of an AC circuit, the expansion and contraction of the ceramic material can vary along with the period of the voltage change across capacitor 102. Thus, outline 112 (dashed lines) can illustrate a typical deformation when the polarity of an applied voltage is a first state and outline 113 (dotted lines) can illustrate a typical deformation when the polarity of the applied voltage is a second state (opposite to the first state).

Figure 1C:
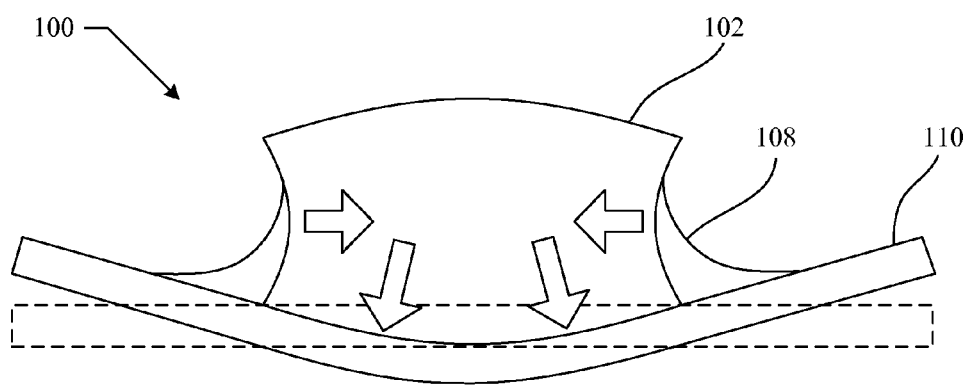
FIG. 1C shows a side view of a PCB including a capacitor, illustrating how piezoelectric displacements can be transferred to the PCB.

FIG. 1C shows a side view of a prior art assembly 100, including capacitor 102 coupled to PCB 110. As in FIG. 1B, capacitor 102 is shown in a deformed state as can occur when ceramic material within capacitor 102 is placed within an electric field. As the voltage difference across capacitor 102 increases, the bottom surface of capacitor 102 can bow outwards, exerting a force on PCB 110. Moreover, an increase in voltage can cause the end surfaces of capacitor 102 near electrodes 106 to bow inwards, pulling on solder fillets 108. The combination of downward force on PCB 110 and pulling on solder fillets 108 can cause a downward displacement of PCB 110 in a region surrounding capacitor 102. When capacitor 102 is placed in an AC circuit, this downward displacement can vary periodically in accordance with the AC frequency. As a result, PCB 110 can vibrate at a frequency equal to the AC frequency or a harmonic of the AC frequency. The amplitude of the vibration can be particularly pronounced when a resonant frequency of PCB 110 is at or near the AC frequency or a harmonic of the AC frequency. This vibration can cause PCB 110 to act as a speaker membrane, creating an acoustic noise. In some cases, this acoustic noise can have an amplitude great enough to be audible to a user of a device.

Figure 2A:
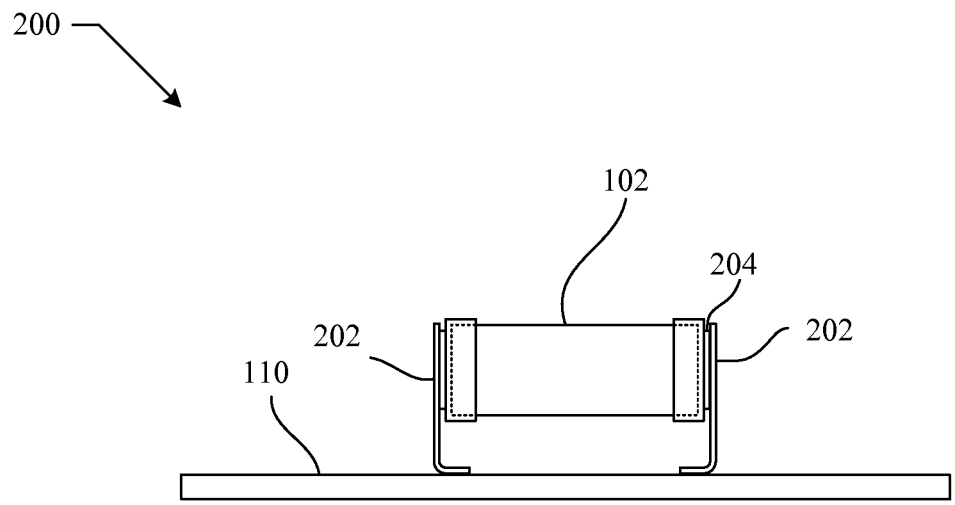
FIG. 2A shows a means of attaching a capacitor to a PCB.
Figure 2B:
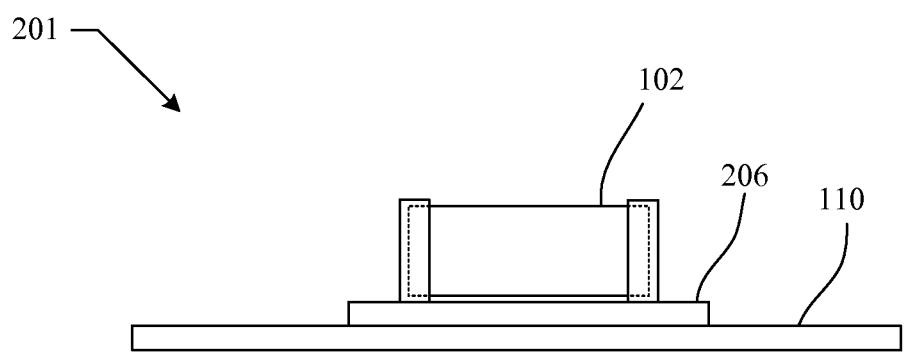
FIG. 2B shows a means of attaching a capacitor to a PCB.

FIGS. 2A and 2B show several prior art solutions for reducing an amount of vibrational energy transferred from capacitor 102 to PCB 110. In FIG. 2A, assembly 200 is shown. Metal connectors 202 can be soldered to electrodes at the ends of capacitor 102 and coupled to PCB 110. Metal connectors 202 can be designed to prevent any direct contact between capacitor 102 and PCB 110 as well as absorb any mechanical vibrations transferred from the ends of capacitor 102. However, metal connectors 202 can add a significant amount of height to assembly 200. Many modern devices, such as mobile phones, have strict space requirements for PCB assemblies that make undesirable the use of designs similar to assembly 200 to isolate capacitor 102. In FIG. 2B, assembly 201 is shown. Assembly 201 can include interposer board 206 placed between capacitor 102 and PCB 110. Interposer board 206 can provide an electrical connection between electrodes on capacitor 102 and a corresponding land pattern on PCB 110. Moreover, interposer board 206 can be formed from a material designed to dampen any displacements in capacitor 102, reducing an amount of vibrational energy transferred to PCB 110. However, assembly 200 can also exceed space restrictions in many devices. Interposer board 206 can increase an area taken up by capacitor 102 on PCB 110 as well as increase the height of capacitor 102. These space increases can prevent the use of assembly 201 in many designs.

FIG. 3 shows front and side views of capacitor assembly 300. Conductive features 302 can be mechanically and electrically coupled to a lower surface of capacitor 102 in four corners by conductive pad bond areas 304. Accordingly, pad bond areas 304 may be disposed proximal to a piezoelectric node of capacitor assembly 300. Magnified view 306 shows a cross-sectional view of one embodiment of conductive features 302. Accordingly, conductive feature 302 may be in the shape of a sphere, although other shapes and profiles are also consistent with embodiments of the present disclosure. At the center, conductive feature 302 can include solid core 312. Solid core 312 can be made of a heat resistant material such as high temperature plastic along the lines of divinylbenzene copolymer. The use of a plastic core can decrease the rigidity of conductive feature 302 (i.e., lower modulus of elasticity), providing a dampening effect on vibrational energy transmitted from capacitor 102. In addition to solid core 312, conductive feature 302 can include outer solder layer 308 that can temporarily liquefy during a bonding operation thereby providing a mechanism for forming a reliable conductive pathway between capacitor 102 and PCB 110. In some embodiments, conductive feature 302 can also include an inner conductive layer 310, made of a conducting material such as copper. Since copper melts at a higher temperature than most solder composites, inner conductive layer 310 can help maintain the overall conductivity of conductive feature 302 if portions of outer solder layer 308 wick away from the surface of conductive feature 302. More generally, layers 308 and 310 may include a conductive material having a first and a second melting temperature, respectively. Accordingly, a second melting temperature of inner layer 310 is desirably higher than a first melting temperature of outer layer 308. For example, in some embodiments the second melting temperature of inner layer 310 may be about 300° C., while the first melting temperature of outer layer may be about 260° C.

An example of conductive feature 302 may be a conductive sphere trade named Micropearl™, and manufactured by Sekisui Chemical Co. of Japan and is commercially available in sizes between 40 and 800 microns (1 micron=$10^{-6}$ m). In some embodiments, conductive features 302 may be spheres having a diameter between 80 and 200 microns. For example, spheres having a diameter of 80 microns, 110 microns may be used, or even 50 microns.

Many varying embodiments of conductive features 302 can be used. In another embodiment, conductive feature 302 can be formed from an outer layer of low temperature solder and an inner core of high temperature solder. The bonding process can then be configured to provide sufficient heat to melt the outer layer but not the inner layer. In yet another embodiment, conductive features 302 can include any suitable shape. For example, a hemispherical shape can be created by cutting a sphere or similar shape along a plane. More generally, conductive feature 302 may include a 'bump', or a non-spherical conductive feature. A resulting planar surface can then be coupled to capacitor 102. In other embodiments, shapes such as cubes and cylinders can be used in place of conductive features 302.

Capacitor assembly 300 can be completed by coupling conductive spheres 302 to capacitor 102 using any technically feasible means that can provide a robust mechanical and electrical connection. In one embodiment, conductive spheres 302 can be coupled to capacitor 102 using solder. In another embodiment, a conductive adhesive can be used to form a bond between conductive spheres 302 and capacitor 102. In yet another embodiment, conductive features 302 can be welded to capacitor 102 using a process such as laser welding.

FIG. 4A shows assembly 400, illustrating how capacitor 102 can be coupled to PCB 110 using conductive spheres 302. Land pattern 404 can be included on an upper surface of PCB 110 and configured to align with conductive features 302 coupled to capacitor 102. During an assembly operation, conductive features 302 can be brought in contact with land pattern 404 and bonded in place using solder 402. In another embodiment, conductive features 302 can be coupled to land pattern 404 using other means such as conductive adhesive or welding. Solder 402 can wick upwards to form a fillet between land pattern 404 and conductive features 302, providing a mechanical and electrical connection between capacitor assembly 300 and PCB 110.

FIG. 4B shows assembly 400, illustrating how capacitor 102 can deform when placed in an AC circuit. Conductive features 302 can provide vertical separation between PCB 110 and capacitor 102 so the bottom surface of capacitor 102 cannot impart any forces directly on PCB 110. Moreover, positioning conductive features 302 in the corners of the bottom surface of capacitor 102 can minimize an amount of vibrational energy transferred to PCB 110. Piezoelectric forces generated within capacitor 102 can cause a larger magnitude of deflections in areas towards the middle of surfaces of capacitor 102 as shown by arrows in FIG. 4B. By locating conductive features 302 in the corners of capacitor 102, the magnitude of vibrational energy transferred from capacitor 102 to PCB 110 can be reduced.

Figure 4C:
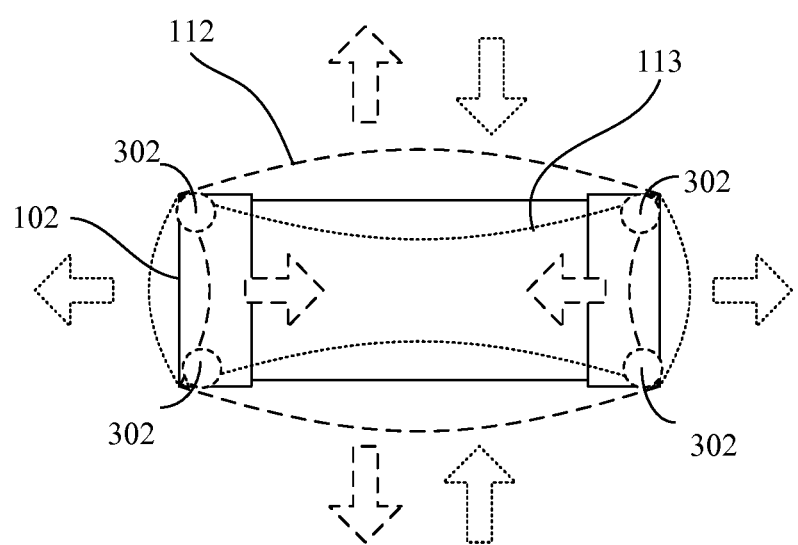
FIG. 4C shows a plan view of how piezoelectric displacement affects an assembly in which a capacitor is coupled to a PCB using conductive spheres.

FIG. 4C shows a plan view of how piezoelectric displacement affects an assembly in which a capacitor is coupled to a PCB using conductive features 302. FIG. 4C shows that during AC operation, the swelling and shrinking of portions of capacitor 102 is substantially reduced at the corner of a typically square capacitor, relative to other points of the perimeter. That is, in some embodiments as disclosed in FIG. 4C the piezo-electric node may include at least one corner of a rectangular shape capacitor. Moreover, conductive features 302 can be created with overall size as small as 40 microns. A reduced size has a smaller overlap with a strained portion of capacitor 102 when conductive features 302 are at the corners as shown in FIG. 4C. Reduced overall size of conductive features 302 enhances mechanical isolation between capacitor 102 and PCB 110 by using significantly less space than prior art designs. While FIG. 4C illustrates conductive feature 302 in the shape of a sphere having an overall size determined by a diameter, any other shape may be used. Accordingly, conductive features 302 in FIG. 4C may include a bump or a non-spherical conductive feature, consistent with the present disclosure. Outlines 112 and 113 are as described in detail above, in reference to FIG. 1B.

Figure 5:
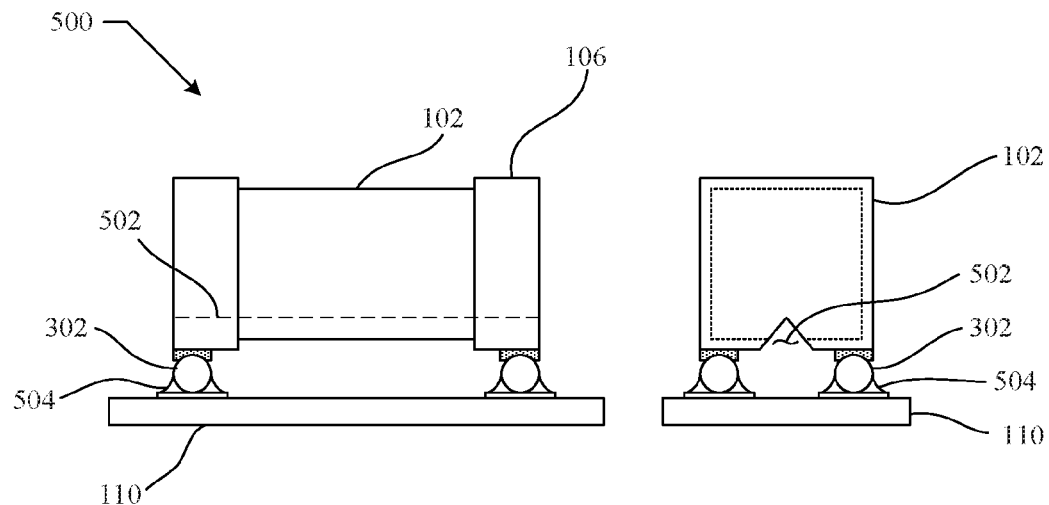
FIG. 5 shows front a side views of a PCB including a capacitor with a groove.

FIG. 5 shows assembly 500, illustrating another embodiment of the present disclosure. Groove 502 can be included in capacitor 102 between conductive features 302. Groove 502 can prevent solder 504 from wicking upwards and adhering along the bottom surface of capacitor 102 during the assembly process. If solder 504 were allowed to wick upwards and form a solid connection with capacitor 102, a more rigid connection would be created, such that vibrations in capacitor 102 could be transmitted to PCB 110. In another embodiment, groove 502 can be replaced by a layer of solder mask applied to the bottom surface of capacitor 102. The solder mask can prevent solder from wicking upwards and adhering to capacitor 102 similar to groove 502. In some embodiments, groove 502 may be filled with a resin. In yet another embodiment, electrode 106 may include a first conductor area separated from a second conductor area by laser ablation.

Figure 6:
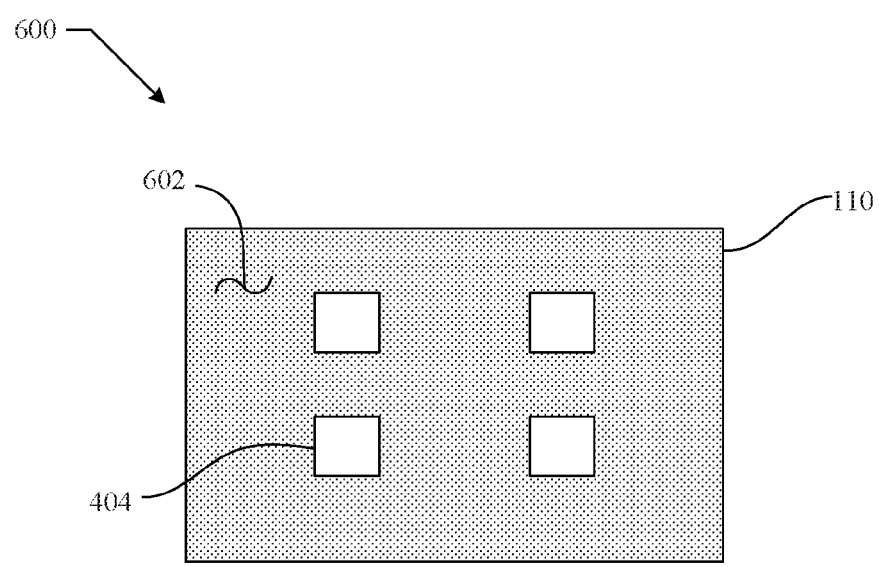
FIG. 6 shows a typical landing pad for a capacitor including conductive spheres.

FIG. 6 shows a plan view of PCB assembly 600, showing a typical land pattern for a capacitor assembly including conductive features. PCB 110 can include land pattern 404, configured to align with conductive features 302 coupled to capacitor 102. Land pattern 404 can include conductive pads coupled to electrical traces overlaid on PCB 110. Moreover, land pattern 404 can include shapes other than squares. For example, circular land patterns can be included and configured to align with conductive features 302. Region 602, including an upper surface of PCB 110 outside of land pattern 404 can be coated with a solder mask to prevent solder from increasing the mechanical connection between capacitor 102 and PCB 110.

Figure 7:
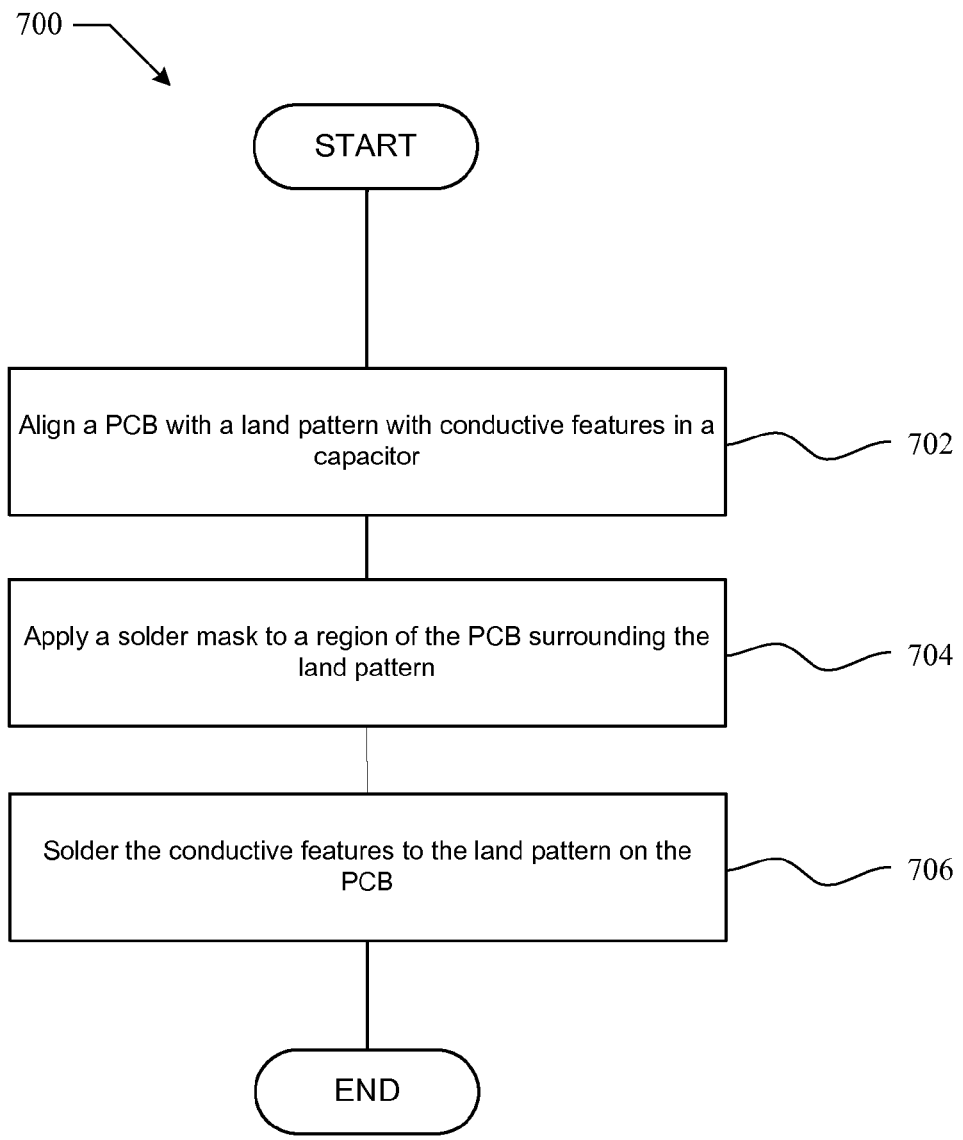
FIG. 7 shows a flow chart depicting a method for coupling a capacitor to a PCB using conductive spheres.

FIG. 7 shows a flow chart depicting method 700 for coupling a capacitor to a PCB using conductive features. The capacitor in process 700 may be an acoustically quite capacitor as disclosed herein (cf. FIGS. 3-5). In step 702, a PCB including a land pattern can be aligned with conductive spheres or the conductive bumps coupled to the capacitor. In step 704, a solder mask can be applied to a region of the PCB surrounding the land pattern. In some embodiments, step 704 may include coating a solder mask on a surface of the PCB. The solder mask may have gaps on the land pattern, thus preventing solder material from overflowing the land pattern and increasing the acoustical coupling between the capacitor and the PCB. Finally, in step 706, the capacitor can be coupled to the PCB by soldering the conductive spheres or conductive bumps to the PCB. Accordingly, in some embodiments step 706 may include applying a heat to raise the temperature of the conductive features in the capacitor to a first melting temperature. Further, step 706 may include selecting the first melting temperature between a low melting temperature of a first conductive material in an outer layer of the conductive feature, and a high melting temperature of a second conductive material in an inner layer of the conductive feature. For example, in some embodiments consistent with the present disclosure the first melting temperature may be a temperature higher than about 260° C. and lower than about 300° C. Accordingly, in some embodiments step 706 includes welding the conductive features to the PCB, for example using laser welding. In some embodiments, step 706 may include removing an excess of soldering material by a laser ablation process. In that regard, step 706 may include determining that the amount of soldering material is sufficient to provide mechanical and electrical contact between the capacitor and the PCB. Also, step 706 may include determining that the amount of soldering material is low enough to provide a desired acoustic decoupling between the capacitor and the PCB.

Figure 8:
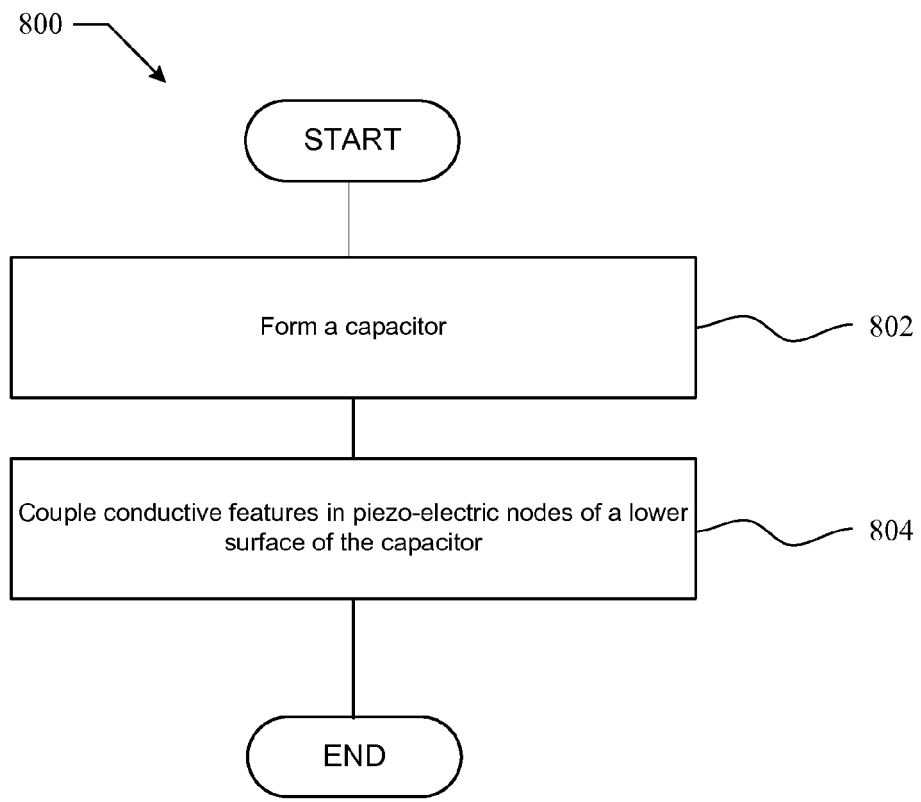
FIG. 8 shows a flow chart of a process of forming an acoustically quiet capacitor, according to some embodiments.

FIG. 8 shows a flow chart of a method 800 of forming an acoustically quiet capacitor, according to some embodiments. In step 802, a capacitor can be formed. Accordingly, step 802 may include forming a monolithic capacitor including the step of forming a first electrode region and forming a second electrode region separated by a dielectric material. Accordingly, some embodiments may include forming a monolithic capacitor of a high dielectric ceramic material including titanium ions. In step 804, conductive features can be coupled to a lower surface of the capacitor and located near piezo-electric nodes of a lower surface of the capacitor. In embodiments where the capacitor has a rectangular shape, a piezo-electric node may include at least one of the outer corners of the lower surface of the capacitor. A piezo-electric node may include a region of the capacitor that is substantially un-strained by a piezoelectric deformation produced during an AC operation of the capacitor. The conductive features can be coupled to the capacitor using solder or any other technically feasible means. Accordingly, step 804 may include forming two exterior layers of conductive material around a core portion of the conductive sphere. In some embodiments, step 704 may further include selecting a high melting temperature conductor to form an inner layer from the two exterior layers. And step 804 may also include selecting a low melting temperature conductor to form an outer layer from the two exterior layers. For example, in some embodiments step 804 may include selecting a high melting temperature to be approximately 300° C., and a low melting temperature to be approximately 260° C. Further according to some embodiments, step 804 may include forming conductive bumps at selected locations of a lower surface of the capacitor. Accordingly, forming the conductive bumps may include electrically coupling the conductive bumps to the first electrode region and to the second electrode region. In that regard, step 804 may include selecting a location of a lower surface of the capacitor according to a strain pattern in a piezoelectric deformation of the dielectric material. For example, selecting a location may include selecting a location proximate to a relatively un-strained corner of the dielectric material.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A printed circuit board (PCB) assembly, comprising: a capacitor, including a dielectric disposed between two electrodes, the capacitor comprising piezo-electric nodes;
   a plurality of conductive features, at least one of the conductive features comprising (i) a core portion, (ii) an outer layer including a first conductive material having a first melting temperature, and (iii) an inner layer between the core portion and the outer layer, the inner layer including a second conductive material having a second melting temperature that is greater than the first melting temperatures; and each conductive feature mechanically and electrically coupled to one of the two electrodes by way of discrete conductive bond pads arranged at each piezo-electric node, wherein each discrete conductive bond pad is separated from each other conductive bond pad; and
   a PCB including at least one substrate layer and electrical traces, wherein the PCB includes a land pattern configured to align with the conductive features, the PCB mechanically and electrically coupled to the capacitor at the conductive feature.

2. The PCB assembly of claim 1, wherein the conductive features comprise at least one of the group consisting of a sphere, a bump, and a non-spherical conductive feature.

3. The PCB assembly of claim 1, wherein the capacitor has a rectangular shape and the piezo-electric nodes are at the four corners of the rectangular shape.

4. A capacitor assembly comprising:
   a capacitor including a first electrode region and a second electrode region, wherein each of the first electrode region and the second electrode region is connected to one of multiple pad bond areas that are located at piezo-electric nodes of the capacitor, each of the multiple pad bond areas is separated from each other pad bond area: and
   multiple conductive features, each electrically and mechanically coupled to one of the multiple pad bond areas at the piezo-electric nodes, wherein at least one of the multiple conductive features comprises (i) a core portion, (ii) an outer layer including a first conductive material having a first melting temperature, and (iii) an inner layer between the core portion and the outer layer, the inner layer including a second conductive material having a second melting temperature that is greater than the first melting temperature.

5. The capacitor assembly of claim 4, wherein at least one of the multiple conductive features is characterized by a curved volume.

6. The capacitor assembly of claim 4, wherein the core portion is spherical.

7. The capacitor assembly of claim 6, wherein the spherical core portion includes a polymer.

8. The capacitor assembly of claim 6, wherein the spherical core portion has a diameter of less than 800 microns.

9. A method for coupling a capacitor to a printed circuit board (PCB), the method comprising: aligning a land pattern in the PCB with a plurality of conductive features located at piezo electric nodes of the capacitor, each conductive feature being coupled to the capacitor via one of multiple bond pads, each of the multiple bond pads is separated from each other bond pads: applying a solder mask to a region of the PCB surrounding the land pattern; and soldering the plurality of conductive features to the land pattern on the PCB by applying a heat to raise a temperature of one of the plurality of conductive features to a first melting temperature that is between a low melting temperature of a first conductive material in an outer layer of the one of the plurality of conductive features, and a high melting temperature of a second conductive material in an inner layer of the one of the plurality of conductive features.

10. The method of claim 9, further comprising preventing solder material from overflowing the land pattern and increasing an acoustical coupling between the capacitor and the PCB.

11. The method of claim 10, wherein the first melting temperature is a temperature higher than about 260 degree.C. and lower than about 300 degree.C.

12. The method of claim 10, wherein soldering the plurality of conductive features to the land pattern comprises laser welding the conductive features to the land pattern.

13. The method of claim 10, further comprising removing an excess of soldering material by a laser ablation process.

* * * * *